(12) United States Patent
Nishigami (10) Patent No.: US 6,872,959 B2
(45) Date of Patent: Mar. 29, 2005

(54) THERMOELECTRON GENERATING SOURCE AND ION BEAM RADIATING APPARATUS WITH THE SAME

(75) Inventor: Yasuaki Nishigami, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 10/638,528

(22) Filed: Aug. 12, 2003

(65) Prior Publication Data

US 2004/0031935 A1 Feb. 19, 2004

(30) Foreign Application Priority Data

Aug. 13, 2002 (JP) .................................... P2002-235381
Mar. 3, 2003 (JP) ...................................... 2003-055765

(51) Int. Cl.[7] .............................. H01J 37/02; G21G 5/00
(52) U.S. Cl. ............................... 250/492.3; 250/492.2; 250/492.21
(58) Field of Search ...................... 250/492.3, 492.21, 250/492.2

(56) References Cited

U.S. PATENT DOCUMENTS

| 4,939,360 | A | * | 7/1990 | Sakai ......................... 250/251 |
| 5,466,929 | A | * | 11/1995 | Sakai et al. .................. 250/251 |
| 5,563,418 | A | * | 10/1996 | Leung .................... 250/492.21 |
| 5,668,372 | A | * | 9/1997 | Iwabuchi et al. ........... 250/310 |
| 6,100,536 | A | * | 8/2000 | Ito et al. ................. 250/492.21 |
| 6,104,025 | A | * | 8/2000 | Tokiguchi et al. .......... 250/251 |
| 6,215,125 | B1 | * | 4/2001 | Chen et al. ............. 250/492.21 |
| 6,348,764 | B1 | * | 2/2002 | Chen et al. ............. 315/111.81 |
| 6,476,399 | B1 | * | 11/2002 | Harrington et al. ..... 250/492.21 |
| 6,501,081 | B1 | * | 12/2002 | Foad et al. ............ 250/492.21 |

FOREIGN PATENT DOCUMENTS

JP          03-093141           4/1991

* cited by examiner

Primary Examiner—John R. Lee
Assistant Examiner—Kalimah Fernandez
(74) Attorney, Agent, or Firm—Finnegan, Henderson, Farabow, Garrett & Dunner, L.L.P.

(57) ABSTRACT

A thermoelectron generating source including a facial main cathode for emitting thermoelectrons by being heated from behind, a filament for heating the main cathode from behind to emit the thermoelectrons, an extraction electrode for extracting the thermoelectrons emitted from the main cathode under an electric field, the extraction electrode being provided near the front of the main cathode, and two deflecting electrodes and disposed on the left and right sides near the front of the extraction electrode to carry the extraction electrode. The potentials of the two deflecting electrodes are kept in a relation $V_L > V_R \geq 0$, where the potential of one deflecting electrode is $V_L$ and the potential of the other deflecting electrode is $V_R$.

9 Claims, 7 Drawing Sheets

THERMOELECTRON GENERATING SOURCE AND ION BEAM RADIATING APPARATUS WITH THE SAME

BACKGROUND OF THE INVENTION

1. Field of the Invention

The present invention relates to a thermoelectron generating source for generating thermoelectrons by an indirect heating method including that is employed to suppress a charge-up on the surface of a substrate in radiating an ion beam, and an ion beam radiating apparatus having such thermoelectron generating source by radiating an ion beam to the substrate to perform the ion implantation or other treatment.

2. Description of the Related Art

In an ion implantation apparatus, if an ion beam is applied onto a substrate of irradiated object, positive charges of ions making up the ion beam are accumulated on the surface of the substrate to produce a charge-up (electrification). If this charge-up is left away, a semiconductor device formed on the surface of the substrate breaks down dielectrically.

To prevent this dielectric breakdown, a variety of techniques for suppressing (relieving) the charge-up using electrons have been already offered. One of the techniques involves producing a plasma and employing electrons in the plasma (e.g., refer to patent document 1).

[Patent Document 1]

JP-A-3-93141 (left lower column at page 2, right lower column at page 2, FIG. 1)

With this technique, a small plasma source is placed near the substrate, electrons of low energy in a plasma produced by this plasma source are led together with the ion beam to the substrate to neutralize positive charges of ions with the electrons, thereby suppressing the charge-up.

However, the technique employing the plasma source has the following problems: (a) the energy distribution of electrons in the plasma led out from the plasma source has a range from about 10 eV to about 20 eV, which is still too high, and (b) a gas required for plasma production flows out of the plasma source into a beam line to aggravate the degree of vacuum.

Particularly in the problem (a), if electrons are excessively supplied to the substrate, a negative electrification is caused on the substrate by the electrons, so that an electrification voltage on the surface of the substrate is increased to a voltage (e.g., about 10 to 20V) corresponding to the energy of electron. In recent years, there is a great demand for suppressing electrification on the surface of the substrate to make the electrification voltage on the surface of the substrate lower. For example, when a semiconductor device is produced by radiating ion beam for ion implantation into a semiconductor substrate, there is a demand for suppressing the electrification voltage for ion implantation to a lower value (e.g., about ±6V or less) to prevent dielectric breakdown of the semiconductor device, because the semiconductor device is micro structured in recent years, but the conventional technique employing the plasma source can not meet this demand.

In order to solve the above-mentioned problems (a) and (b), there is a technique for suppressing the charge-up by generating thermoelectrons from a thermoelectron generating source of the indirect heating.

This technique involves heating a facial main cathode, employing a filament provided behind it, emitting a large amount of thermoelectrons from the main cathode, extracting the thermoelectrons through an extraction electrode, conducting the thermoelectrons together with an ion beam to the substrate, and neutralizing positive charges of the ion beam with the thermoelectrons to suppress the charge-up.

With this technique employing the thermoelectron generation source of the indirect heating type, the potential of the main cathode is set to be lower (e.g., in a range from 0V to −6V) than that of the substrate holder, whereby a large amount of thermoelectrons having a low energy from 0 eV to 6 eV are generated for neutralization to suppress the negative electrification voltage of the substrate to 6V or less. Hence, it is possible to suppress the charge-up of the substrate caused by ion beam radiation to be low.

However, the above thermoelectron generation source of the indirect heating type has a problem that the energy of thermoelectrons led out of the extraction electrode is very low, and a large amount of thermoelectrons are generated to stay (accumulate) near the front of the extraction electrode, so that extracting the thermoelectrons from the extraction electrode is prevented (limited) by negative space charges (negative potential) of the thermoelectrons.

SUMMARY OF THE INVENTION

It is an object of the invention to provide a thermoelectron generating source capable of generating a large amount of thermoelectrons of low energy by relieving the space charge limitation in extracting the thermoelectron. Also, it is another object of the invention to provide an ion beam radiating apparatus in which a charge-up on the surface of a substrate in radiating the ion beam is effectively suppressed by leading the thermoelectrons generated from the thermoelectron generating source near the substrate efficiently.

According to one aspect of the present invention, there is provided with a thermoelectron generating source including a facial main cathode for emitting thermoelectrons by being heated from behind, a filament for heating the main cathode from behind to emit the thermoelectrons, an extraction electrode for extracting the thermoelectrons emitted from the main cathode under an electric field, the extraction electrode being provided near the front of the main cathode, and two deflecting electrodes disposed on the left and right sides near the front of the extraction electrode to carry the extraction electrode, in which a relation $V_L > V_R \geq 0$ holds, where one potential is $V_L$ and the other potential is $V_R$.

With this thermoelectron generating source, the potentials of two deflecting electrodes disposed on the left and right sides near the front of the extraction electrode to carry the extraction electrode are kept in a relation $V_L > V_R \geq 0$, whereby it is possible to generate the positive potentials over the entire area between the two deflecting electrodes. Thereby, negative space charges (negative potential) due to thermoelectrons near the front of the extraction electrode are canceled. As a result, a large amount of thermoelectrons having low energy can be generated by relieving the space charge limitation in extracting the thermoelectrons.

According to another aspect of the invention, there is provided an ion beam radiating apparatus for radiating an ion beam to a substrate held on a holder to process the substrate, the ion beam radiating apparatus having a thermoelectron generating source for emitting thermoelectrons to a route of the ion beam, the thermoelectron generating source being placed sideways of the route of the ion beam, the thermoelectron generating source including a facial main cathode for emitting thermoelectrons by being heated from behind, the main cathode being kept at a potential in a range from 0V to −6V relative to the holder, a filament for heating the main cathode from behind to emit the thermoelectrons, an extraction electrode for extracting the thermoelectrons emitted from the main cathode under an electric field, the extraction electrode being provided near the front of the main cathode and kept at the same potential as the holder, two deflecting electrodes disposed on the left and right sides near the front of the extraction electrode to carry the extraction electrode, the mutual opposed faces of the two deflecting electrodes being slanted in a direction facing the holder, in which a relation $V_L > V_R \geq 0$ holds, where the potential of one deflecting electrode closer to the holder is $V_L$ and the potential of the other deflecting electrode is $V_R$.

With the thermoelectron generating source constituting this ion beam radiating apparatus, the potentials of two deflecting electrodes disposed on the left and right sides near the front of the extraction electrode to carry the extraction electrode are kept in a relation $V_L > V_R \geq 0$, whereby it is possible to generate the positive potentials over the entire area between the two deflecting electrodes. Thereby, negative space charges (negative potential) due to thermoelectrons near the front of the extraction electrode are canceled. As a result, a large amount of thermoelectrons having low energy can be generated by relieving the space charge limitation in extracting the thermoelectrons.

Since the mutual opposed faces of the two deflecting electrodes are slanted in a direction facing the holder, and the potential $V_L$ of one deflecting electrode closer to the holder is higher than the potential $V_R$ of the other deflecting electrode, the thermoelectrons led out of the extraction electrode are bent in the orbit toward the holder under an electric field between the two deflecting electrodes. As a result, it is possible to efficiently conduct the thermoelectrons generated from the thermoelectron generating source near the substrate held on the holder, and thereby effectively suppress a charge-up on the surface of the substrate in radiating the ion beam.

According to a further aspect of the invention, an thermoelectron generating source constituting an ion beam radiating apparatus may comprise a facial main cathode for emitting thermoelectrons by being heated from behind, the main cathode being kept at a potential in a range from 0V to −6V relative to the holder, a filament for heating the main cathode from behind to emit the thermoelectrons, an extraction electrode for extracting the thermoelectrons emitted from the main cathode under an electric field, the extraction electrode being provided near the front of the main cathode and kept at the same potential as the holder, two first stage deflecting electrodes disposed near the front of the extraction electrode to carry the extraction electrode and be opposed to each other with a space between them, the mutual opposed faces of the two first stage deflecting electrodes being slanted in a direction facing away from the holder, in which a relation $V_{1R} > V_{1L} \geq 0$ holds, where the potential of one first stage deflecting electrode closer to the holder is $V_{1L}$ and the potential of the other first stage deflecting electrode is $V_{1R}$, and two second stage deflecting electrodes disposed near the front of the first stage deflecting electrodes and opposed to each other with a space between them, the space between the second stage deflecting electrodes being in communication to the space between the first stage deflecting electrodes, the mutual opposed faces of the two second stage deflecting electrodes being slanted in a direction facing the holder, in which a relation $V_{2L} > V_{2R} \geq 0$ holds, where the potential of one second stage deflecting electrode closer to the holder is $V_{2L}$ and the potential of the other second stage deflecting electrode is $V_{2R}$.

With this constitution, the potentials of two first stage deflecting electrodes are kept in a relation $V_{1R} > V_{1L} \geq 0$, whereby it is possible to generate the positive potentials over the entire area between the two deflecting electrodes. Also, the potentials of two second stage deflecting electrodes are kept in a relation $V_{2L} > V_{2R} \geq 0$, whereby it is possible to generate the positive potentials over the entire area between the two deflecting electrodes. Thereby, negative space charges (negative potential) due to thermoelectrons near the front of the extraction electrode are canceled. As a result, a large amount of thermoelectrons having low energy can be generated by relieving the space charge limitation in extracting the thermoelectrons.

Since the mutual opposed faces of the two first stage deflecting electrodes are slanted in a direction facing away from (i.e., opposite to) the holder, and the potential $V_{1L}$ of one deflecting electrode closer to the holder is lower than the potential $V_{1R}$ of the other deflecting electrode, the thermoelectrons led out of the extraction electrode are firstly bent in the direction facing away from the holder under an electric field between the two first stage deflecting electrodes. Moreover, since the mutual opposed faces of the two second stage deflecting electrodes are slanted in a direction facing the holder, and the potential $V_{2L}$ of one deflecting electrode closer to the holder is higher than the potential $V_{2R}$ of the other deflecting electrode, the thermoelectrons passing through the first stage deflecting electrodes are bent back in the direction facing the holder under an electric field between the two second stage deflecting electrodes. As a result, it is possible to efficiently conduct the thermoelectrons generated from the thermoelectron generating source near the holder and the substrate held on the holder, and thereby effectively suppress a charge-up on the surface of the substrate in radiating the ion beam.

Moreover, since the thermoelectrons are bent back as above described, it is difficult to view the extraction electrode of the thermoelectron generating source and the main cathode provided behind it from the substrate held on the holder. Consequently, it is possible to suppress metal particles produced from the main cathode and the extraction electrode by heating from jumping into the substrate, and prevent the substrate from being contaminated with the metal particles.

The potential of the extraction electrode in the thermoelectron generating source may be kept at a positive potential relative to the main cathode.

Since the energy of thermoelectrons in getting to the substrate is decided depending on a potential difference between the main cathode and the holder, it is possible to control the amount of extracting the thermoelectrons in accordance with the potential of the extraction electrode relative to the main cathode, without having influence on the energy of thermoelectrons in getting to the substrate (i.e., independently of the energy).

According to another aspect of the invention, there is provided with an ion beam radiating apparatus for radiating anion beam to a substrate held on a holder to process the substrate, the ion beam radiating apparatus having a thermoelectron generating source for emitting thermoelectrons toward a route of the ion beam, the thermoelectron generating source being placed sideways of the route of the ion beam, characterized in that the thermoelectron generating source is disposed obliquely to the upstream side of the ion beam so that the angle of the ion beam made to the vertical line stood on a front face of the thermoelectron generating source may be in a range from 30° to 60°, the thermoelectron generating source including a facial main cathode for emitting thermoelectrons by being heated from behind, the main cathode being kept at a potential in a range from 0V to −6V relative to the holder, a filament for heating the main cathode from behind to emit the thermoelectrons, an extraction electrode for extracting the thermoelectrons emitted from the main cathode under an electric field, the extraction electrode being provided near the front of the main cathode and kept at the same potential as the holder, and two deflecting electrodes disposed on the left and right sides near the front of the extraction electrode to carry the extraction electrode, the mutual opposed faces of the two deflecting electrodes being slanted in a direction facing the ion beam, in which a relation $V_L>V_R \geqq 0$ holds, where the potential of one deflecting electrode closer to the ion beam is $V_L$ and the potential of the other deflecting electrode is $V_R$, and the ion beam radiating apparatus further includes a pair of upstream deflecting electrodes disposed in front of the thermoelectron generating source and at the positions almost symmetrical around the route of the ion beam, at least the faces of the pair of upstream deflecting electrodes opposing the ion beams being curved, in which a relation $0 \geqq V_D > V_U$ holds, where the potential of one upstream deflecting electrode closer to the thermoelectron generating source is $V_D$ and the potential of the other upstream deflecting electrode is $V_U$.

With the thermoelectron generating source constituting this ion beam radiating apparatus, the potentials of two deflecting electrodes disposed on the left and right sides near the front of the extraction electrode to carry the extraction electrode are kept in a relation $V_L>V_R \geqq 0$, whereby it is possible to generate the positive potentials over the entire area between the two deflecting electrodes. Thereby, negative space charges (negative potential) due to thermoelectrons near the front of the extraction electrode are canceled. As a result, a large amount of thermoelectrons having low energy can be generated by relieving the space charge limitation in extracting the thermoelectrons.

Since the mutual opposed faces of the two deflecting electrodes are slanted in a direction facing the ion beam, and the potential $V_L$ of one deflecting electrode closer to the ion beam is higher than the potential $V_R$ of the other deflecting electrode, the thermoelectrons led out of the extraction electrode are bent in the orbit to traverse the ion beam under an electric field between the two deflecting electrodes. Moreover, a pair of upstream deflecting electrodes are disposed in front of the thermoelectron generating source, in which a relation $0 \geqq V_D > V_U$ holds, whereby the thermoelectrons led out of the thermoelectron generating source are subjected to a force that tends to bend the ion beam downstream (i.e., to the holder side) under an electric field formed between the two electrodes and the ion beam having positive potential and directed to the substrate. As a result, it is possible to efficiently conduct the thermoelectrons generated from the thermoelectron generating source near the holder and the substrate held on the holder, and thereby effectively suppress a charge-up on the surface of the substrate in radiating the ion beam.

Moreover, since the thermoelectron generating source is disposed obliquely to the upstream side of the ion beam as above described, it is difficult to view the extraction electrode of the thermoelectron generating source and the main cathode provided behind it from the substrate held on the holder. Consequently, it is possible to suppress metal particles produced from the main cathode and the extraction electrode by heating from jumping into the substrate, and prevent the substrate from being contaminated with the metal particles.

DESCRIPTION OF THE PREFERRED EMBODIMENTS

Figure 1:
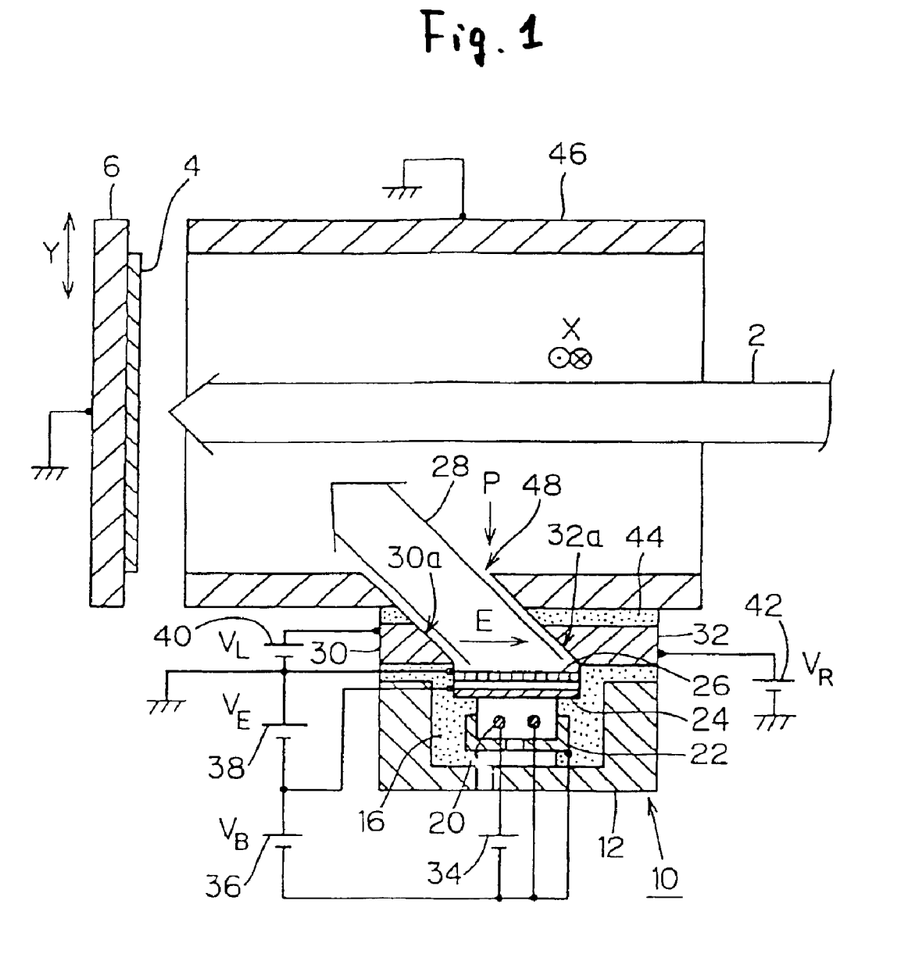
FIG. 1 is a cross-sectional view of an ion beam radiating apparatus having a thermoelectron generating source according to one embodiment of the present invention.
Figure 2:
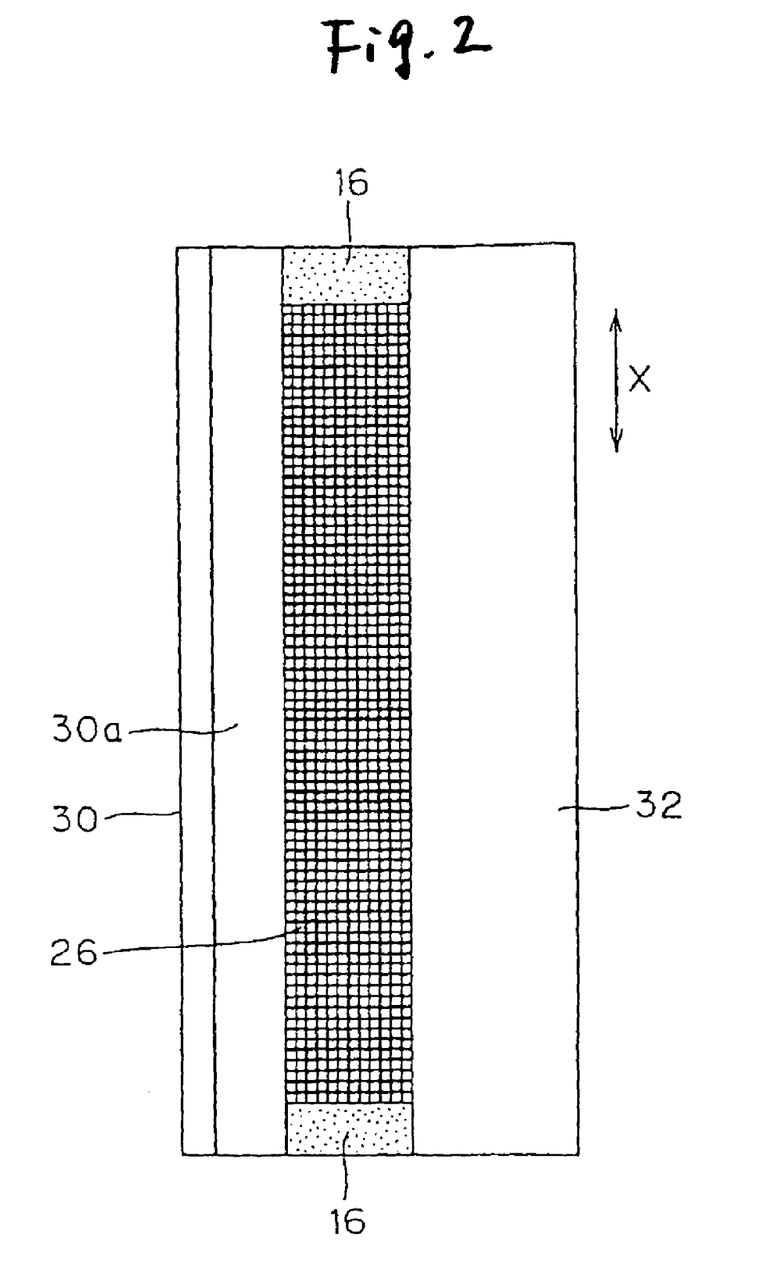
FIG. 2 is a view showing the deflecting electrodes in the thermoelectron generating source, as seen from a direction of the arrow P in FIG. 1.

FIG. 1 is a cross-sectional view of an ion beam radiating apparatus having a thermoelectron generating source according to one embodiment of the present invention. FIG. 2 is a view showing the deflecting electrodes in the thermoelectron generating source, as seen from a direction of the arrow P in FIG. 1. In this specification, the downstream side means the side where the ion beam 2 proceeds, and the upstream side means the side opposite to the side where the ion beam 2 proceeds.

This ion beam radiating apparatus radiates an ion beam 2 to a substrate (e.g., a semiconductor substrate) 4 of the irradiated object held on a holder 6 to process the substrate 4 by ion implantation. A route of the ion beam 2, the substrate 4 and the holder 6, and the inside of the thermoelectron generating source 10 are placed in a vacuum atmosphere (evacuated). The same applies in another embodiment as will be described later.

To radiate the ion beam 2 evenly over the entire surface of the substrate 4, at least one of the ion beam 2 and the holder 6 holding the substrate 4 may be scanned in radiating the ion beam 2. In this example, the ion beam 2 is scanned reciprocatively in an X direction (e.g., horizontal direction) by a scanner, not shown, and the holder 6 is mechanically scanned reciprocatively in a Y direction (e.g., vertical direction) substantially orthogonal to the X direction. The potential of the holder 6 is a ground potential in this example.

The thermoelectron generating source 10 for emitting thermoelectrons 28 to the route of the ion beam 2 is disposed near the upstream side of the holder 6 and sideways of the route of the ion beam 2. This thermoelectron generating source 10 is attached and held via an insulator 44 to a cylindrical beam line vessel 46 through which the ion beam 2 passes in this example. The beam line vessel 46 has an opening portion 48 for passing the thermoelectrons 28. The beam line vessel 46 is made of metal in this example and placed at the ground potential. However, the thermoelectron generating source 10 may be attached and held on a holding board made of an insulating material, in which case there is no need for the insulator 44.

The thermoelectron generating source 10 has a rectangular parallelepiped shape that is longer in the X direction to produce the thermoelectrons 28 wider in the X direction to scan the ion beam 2 in the X direction in this example.

The thermoelectron generating source 10 includes a metallic container 12 with one face (front face) opened, a U-character shaped filament 20 provided in the container, a facial main cathode 24 provided near the front of the container, namely, near an opening portion of the container 12, and a porous extraction electrode 26 provided near the front of the container in this example. A back electrode 22 is provided from the side to the rear of the filament 20. The filament 20, the back electrode 22, the main cathode 24 and the porous extraction electrode 26 are electrically insulated from each other and the container 12 by an insulating material (e.g., an insulator 16).

The filament 20 heats the main cathode 24 from behind to emit the thermoelectrons 28, in which the main cathode is heated by a filament electrode 34 of variable output to emit the thermoelectrons.

An electron impact power source 36 having a variable DC output voltage $V_B$ is connected between one end of the filament 20 (a negative electrode end of the filament electrode 34) and the main cathode 24, with the former being at the negative electrode side. This output voltage $V_B$ is from about 100V to about 500V. The thermoelectrons emitted from the filament 20 are accelerated at this voltage $V_B$ to collide against the main cathode 24 and heat the main cathode 24 with its collision energy and a radiant energy of the filament 20 to emit the thermoelectrons 28.

The back electrode 22 is made of carbon, for example. This back electrode 22 is connected to the one end of the filament 20 (i.e., negative electrode end of the filament power source 34), and prevents the voltage $V_B$ from being not normally applied due to space charges of thermoelectrons emitted from the filament 20, whereby it is preferable to provide the back electrode 22. That is, since excess thermoelectrons not accelerated toward the main cathode 24 among the thermoelectrons emitted from the filament 20 can be flowed to the back electrode 22, the back electrode 22 prevents excess thermoelectrons from staying around the filament 20 and the voltage $V_B$ from being not normally applied between the filament 20 and the main cathode 24 due to space charges of excess thermoelectrons.

The main cathode 24 is heated in the above manner to emit the thermoelectrons 28, and has a facial shape. For example, it is like a thin plate. This main cathode 24, which is facial, can emit a larger amount of thermoelectrons 28 than a linear cathode. The main cathode 24 is made of a metal such as Ta or a material such as SiC.

The extraction electrode 26 extracts the thermoelectrons 28 emitted from the main cathode 24 under an electric field. It may be like a mesh as shown in FIG. 2 or a porous plate having a number of small pores. This extraction electrode 26 is made of metal, for example.

The extraction electrode 26 is kept at the same potential as the holder 6 in this example. In this example, since the potential of the holder 6 is the ground potential as previously described, the extraction electrode 26 is grounded and kept at the ground potential.

The main cathode 24 is kept at the potential in a range from 0V to −6V relative to the holder 6, preferably a range from 0V to −3V. Since the potential of the holder 6 is the ground potential as previously described, the main cathode 24 is kept in a range from 0V to −6V relative to the ground potential, preferably a range from 0V to −3V in this example. To realize this, an extraction power source 38 having a variable DC output voltage $V_E$ is connected between the main cathode 24 and the extraction electrode 26, with the former being at the negative electrode side. And the output voltage $V_E$ is kept in a range from 0V to 6V, preferably from 0V to 3V.

The energy of thermoelectrons 28 in getting to the substrate 4 on the holder 6, corresponding to a potential difference between the main cathode 24 and the holder 6, is kept in a range from 0 eV to 6 eV, preferably from 0 eV to 3 eV in this example. Even if the deflecting electrodes 30 and 32 are provided as will be described later, the energy of thermoelectrons 28 in getting to the substrate 4 on the holder 6 is the same as above. This is because even if the thermoelectrons 28 led out of the extraction electrode 26 are accelerated due to a positive potential between the deflecting electrodes 30 and 32, the thermoelectrons 28 passing between the deflecting electrodes 30 and 32 are decelerated due to the same potential, so that the energy of thermoelectrons 28 getting to the substrate 4 is finally decided in the above manner with the potential difference between the main cathode 24 and the holder 6.

The two deflecting electrodes 30 and 32 are arranged on the left and right sides near the front of the extraction electrode 26 (in other words, the upstream and downstream sides of the ion beam 2 in the travel direction) to carry the extraction electrode 26 and be opposed to each other with a space between them. The two deflecting electrodes 30 and 32 are arranged in parallel and spaced from each other along a longitudinal direction, or the X direction, of the thermoelectron generating source 10. The end portions of the two deflecting electrodes 30 and 32 are electrically insulated by an insulating material (e.g., the insulator 16) (see FIG. 2).

The mutual opposed faces 30a and 32a of the two deflecting electrodes 30 and 32 are slanted with respect to the extraction electrode 26. More specifically, they are slanted in a direction facing the holder 6.

A deflecting power source 40 having a variable DC output voltage $V_L$ is connected between one deflecting electrode 30 closer to the holder 6 and a ground potential portion, with the former being at the positive electrode side. Also, a deflecting power source 42 having a variable DC output voltage $V_R$ is connected between the other deflecting electrode 32 and the ground potential portion, with the former being at the positive electrode side. Two output voltages $V_L$ and $V_R$ are kept in a relation $V_L > V_R \geq 0$. The output voltages $V_L$ and $V_R$ are measured from the ground potential, and called the potential of the deflecting electrodes 30 and 32, respectively. That is, in the above constitution, a relation $V_L > V_R \geq 0$ holds, where the potential of the deflecting electrode 30 closer to the holder 6 is $V_L$ and the potential of the other deflecting electrode 32 is $V_R$. As an example of the potentials, the potential $V_L$ is from about 10V to 20V, and the potential $V_R$ is from about 0V to 10V, in which the above relation is satisfied.

With the thermoelectron generating source 10, the potentials of the two deflecting electrodes 30 and 32 that are arranged on the left and right sides near the front of the extraction electrode 26 to carry the extraction electrode 26 are kept in the relation $V_L > V_R \geq 0$, so that the positive potential can be generated over the entire area between the two deflecting electrodes 30 and 32. That is, a plurality of equipotential surfaces parallel to the mutual opposed faces 30a and 32a are generated between the two deflecting electrodes 30 and 32, in which their potentials are distributed over a range from $V_L$ to $V_R$. Those positive potentials cancel the negative space changes (negative potentials) caused by the thermoelectrons near the front of the extraction electrode 26 as previously described. From another point of view, between the two deflecting electrodes 30 and 32, an electric field from one electrode 30 to the other electrode 32 is generated by keeping the potentials of the two deflecting electrodes 30 and 32 in the relation $V_L > V_R \geq 0$. And even if the electrons stay as a cloud near the front of the extraction electrode 26, the electrons are pulled toward the deflecting electrode 30 at positive potential in an opposite direction to the electric field E and absorbed into the deflecting electrode 30, whereby it is possible to prevent the thermoelectrons from staying, and cancel negative space charges caused by the thermoelectrons. As a result, the space charge limitation in front of the extraction electrode 26 is relieved in extracting the thermoelectrons 28, whereby a large amount of thermoelectrons 28 of low energy are generated from the thermoelectron generating source 10.

This thermoelectron generating source 10 generate a large amount of thermoelectrons 28 of low energy in the above manner to emit the thermoelectrons through the opening portion 48 of the beam line vessel 46 toward the route of the ion beam 2 in this example. And the thermoelectrons 28 are conducted to the substrate 4, together with the ion beam 2, and serve to relieve a charge-up on the surface of the substrate in radiating the ion beam. Another embodiment as will be described later has the same effect.

As a result, positive charges on the surface of the substrate due to the ion beam 2 are not only fully neutralized, but also the negative electrification voltage of the substrate 4 can be suppressed to 6V (preferably 3V) or less, because even if excessive amount of thermoelectrons 28 get to the substrate 4, the energy of thermoelectrons is as low as from 0 eV to 6 eV (preferably from 0 eV to 3 eV) as previously described. That is, the charge-up of the substrate 4 caused by the ion beam radiation is suppressed to a very small value. Accordingly, the thermoelectron generating source 10 and the ion beam radiating apparatus having it are fully applied to the manufacture of semiconductor devices that are microstructured. The same applies in another embodiment as will be described later.

Also, this thermoelectron generating source 10, which employs no plasma production gas, does not aggravate the degree of vacuum in the beam line or a substrate treatment chamber. Accordingly, it is possible to prevent less uniform implantation from being caused by worse degree of vacuum, and prevent an error in the amount of implantation from occurring. Another embodiment as will be described later has the same effect.

And in this thermoelectron generating source 10, the potential $V_L$ of the deflecting electrode 30 closer to the holder 6 is higher than the potential $V_R$ of the other deflecting electrode 32, so that an electric field E passing from the former to the latter is generated, whereby the thermoelectrons 28 led out from the extraction electrode 26 are bent in the orbit toward the holder 6 by being subjected to the resultant of a force straightly led out by the extraction electrode 26 and a force exerted from the electric field E. And the mutual opposed faces 30a and 32a of the two deflecting electrodes 30 and 32 are slanted toward the holder 6, namely, in the direction where the thermoelectrons 28 bent in the above manner travel, so that the thermoelectrons 28 are led out to the beam line efficiently by preventing the thermoelectrons 28 from colliding against the deflecting electrodes 30 and 32. As a result, the thermoelectrons 28 generated from the thermoelectron generating source 10 are efficiently conducted near the holder 6 and the substrate held on the holder 6, whereby the charge-up on the surface of the substrate in radiating the ion beam is suppressed more effectively.

Figure 3A:
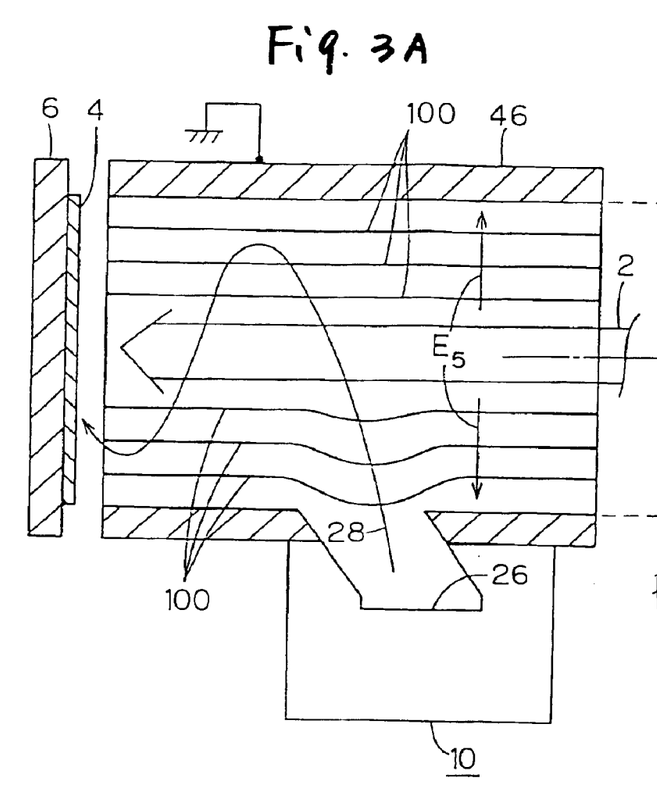
FIG. 3A is a schematic view showing one example of an orbit of a thermoelectron led out from the thermoelectron generating source in FIG. 1.
Figure 3B:
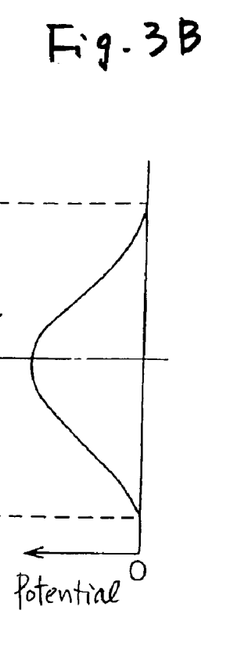
FIG. 3B is a graph showing one example of a potential distribution around an ion beam.

The orbit of the thermoelectrons 28 is examined in more detail as follows. That is, the ion beam 2 has a positive potential (beam potential) due to charges of ions (positive ions) making up it. This potential has a potential distribution in which it is highest at the center of the ion beam 2 and lower toward both the ends, as shown in FIG. 3B. Both the ends of the potential distribution are at the potential (ground potential in this example) of the beam line vessel 46. With this potential distribution, the equipotential surfaces 100 are formed between the ion beam 2 and the beam line vessel 46 and roughly lined up with both. Thereby, an electric field $E_5$ is formed from the center of the ion beam 2 toward the beam line vessel 46. The thermoelectrons 28 led out of the thermoelectron generating source 10 have low energy, and are subjected to a force toward the center of the ion beam 2 under the electric field $E_5$ caused by this beam potential as described above.

In the case where the thermoelectrons 28 led out of the thermoelectron generating source 10 are vertically incident on the ion beam 2, the thermoelectrons 28 are simply reciprocated around the ion beam 2 as the axis. Namely, the reciprocating motion of thermoelectrons 28 is repeated in such a way that the thermoelectrons 28 passing through the ion beam 2 are decelerated and reversed due to a force of the electric field of the ion beam 2 immediately before getting to the beam line vessel 46 opposite the thermoelectron generating source 10, to proceed to the ion beam 2, and the thermoelectrons 28 passing through the ion beam 2 again are decelerated and reversed due to a force of the electric field of the ion beam 2. Therefore, the thermoelectrons 28 are difficult to get to the substrate 4.

On the contrary, in this ion beam radiating apparatus, the thermoelectrons 28 are led out obliquely to the ion beam 2 from the thermoelectron generating source 10 toward the holder 6, namely, the thermoelectrons 28 led out of the thermoelectron generating source 10 have a speed component toward the substrate 4, as described above. Accordingly, the thermoelectrons 28 go to the substrate 4 while drawing a sinusoidal curve around the ion beam as the axis due to a resultant force of the speed component and the electric field $E_5$ of the ion beam 2, as shown in FIG. 3A. Thereby, the thermoelectrons 28 can get to the substrate 4 efficiently. Another embodiment as will be described later has the same effect.

Figure 4:
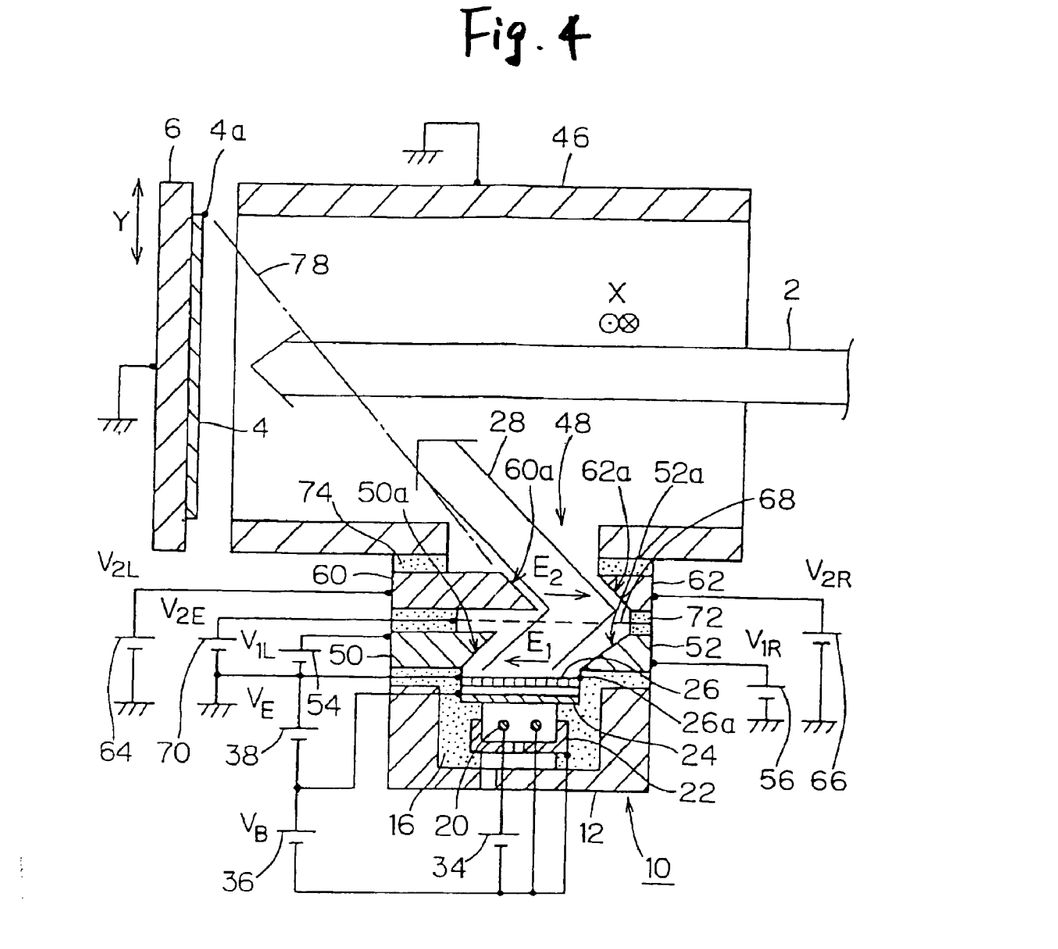
FIG. 4 is a cross-sectional view showing an ion beam radiating apparatus according to another embodiment of the invention.
Figure 6:
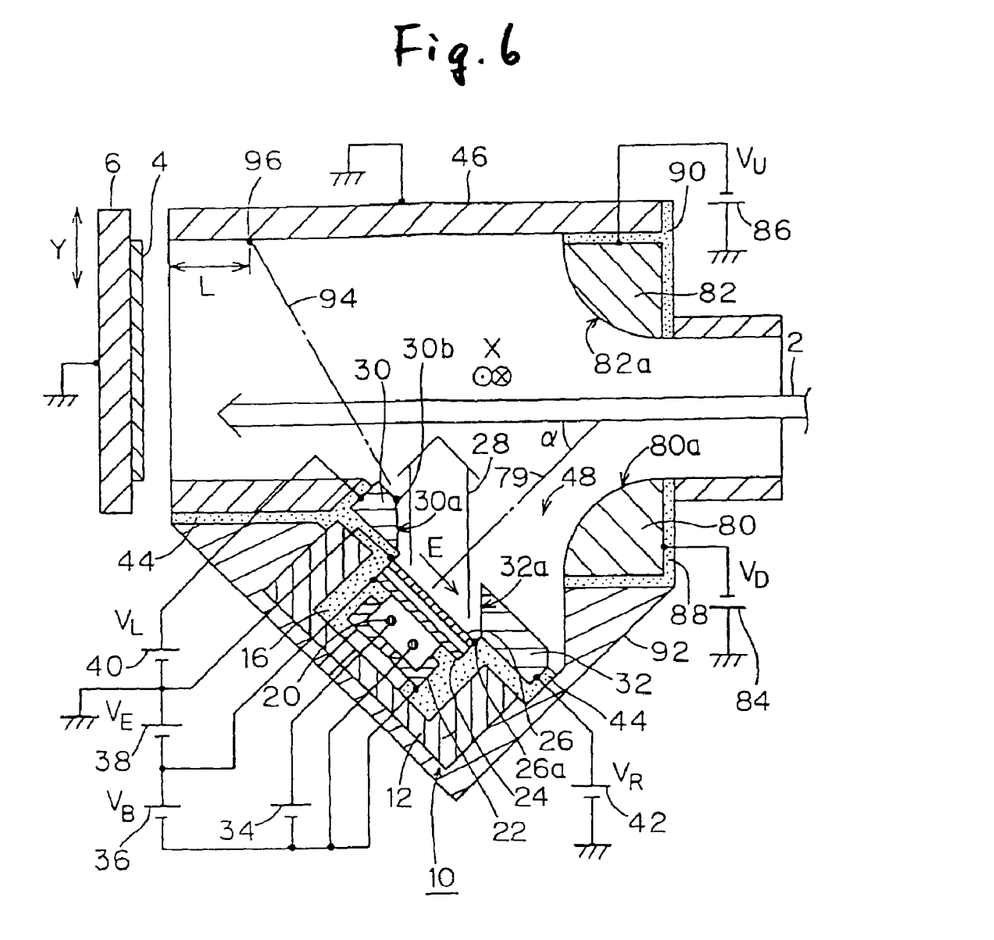
FIG. 6 is a cross-sectional view showing an ion beam radiating apparatus according to a further embodiment of the invention.

The potential of the main cathode 24 will be further described. In the example of FIG. 1, since the extraction electrode 26 is kept at the same potential as the holder 6, if the potential of the main cathode 24 to the holder 6 is near zero, the potential difference between the main cathode 24 and the extraction electrode 26 becomes near zero, so that the thermoelectrons 28 are difficult to extract in some cases. From this point of view, the potential of the main cathode 24 to the holder 6 is preferably kept in a range from −3V to −6V. To realize this, the output voltage $V_E$ of the extraction power source 38 may be kept in a range from 3V to 6V. In this manner, it is possible to keep a potential difference from 3V to 6V between the main cathode 24 and the extraction electrode 26, whereby the thermoelectrons 28 are more likely to extract. In this case, the energy of thermoelectrons 28 getting to the substrate 4 is kept in a range from 3 eV to 6 eV. The same applies with the embodiment as shown in FIGS. 4 and 6 and as will be described later.

The insulator 44 or the opening portion 48 of the beam line vessel 46, especially when the thickness is large, is preferably slanted along the mutual opposed faces 30a and 32a of the deflecting electrodes 30 and 32 as in this example. In this manner, the thermoelectrons 28 bent in the above way are prevented from colliding against the insulator 44 or the beam line vessel 46, and led out to the beam line efficiently.

In the above description, the ion beam radiating apparatus for scanning the ion beam 2 or the holder 6 has been exemplified. However, the thermoelectron generating source 10 as described above is of course applicable to the ion beam radiating apparatus that scans neither the ion beam 2 nor the holder 6. The same applies in another embodiment as will be described later.

By the way, in the ion beam radiation apparatus as shown in FIG. 1, because the mutual opposed faces 30a and 32a of the two deflecting electrodes 30 and 32 are slanted in the direction facing the holder 6, as previously described, the extraction electrode 26 of the thermoelectron generating source 10 and the main cathode 24 provided behind it may be possibly viewed from the substrate 4 held on the holder 6. In such cases, metal particles produced from the main cathode 24 or the extraction electrode 26 are more likely to jump into the substrate 4, along with the heating of the main cathode 24 by the filament 20 and the heating of the extraction electrode 26 due to a radiant heat from the main cathode 24, and the substrate is likely to be contaminated with the metal particles. This contamination is also called a metal contamination, and particularly causes a problem in the manufacture of the semiconductor devices.

Another embodiment with improvements in the above points will be described below. In the following, the same or like parts are designated by the same numerals as in the embodiment of FIG. 1, and different points from the embodiment of FIG. 1 are mainly described.

FIG. 4 is a cross-sectional view showing an ion beam radiating apparatus according to another embodiment of the invention. In this another embodiment, the thermoelectron generating source 10 includes two first stage deflecting electrodes 50 and 52 and two first deflecting power sources 54 and 56, and two second stage deflecting electrodes 60 and 62 and two second deflecting power sources 60 and 62, instead of two deflecting electrodes 30 and 32 and the deflecting power sources 40 and 42 for the thermoelectron generating source 10 as shown in FIG. 1. The first stage deflecting electrodes 50, 52 and the second stage deflecting electrodes 60, 62 are electrically insulated by an insulator 72, and the second stage deflecting electrodes 64, 66 and the beam line vessel 46 are electrically insulated by an insulator 74.

Two first stage deflecting electrodes 50 and 52 are arranged on the left and right sides near the front of the extraction electrode 26 to carry the extraction electrode 26 and be opposed to each other with a space between them. The two first stage deflecting electrodes 50 and 52 are arranged in parallel and spaced from each other along the longitudinal direction (i.e., X direction) of the thermoelectron generating source 10, like the deflecting electrodes 30 and 32.

The mutual opposed faces 50a and 52a of the two first stage deflecting electrodes 50 and 52 are slanted with respect to the extraction electrode 26. More specifically, they are slanted in a direction facing away from the holder 6 (i.e., in an opposite direction to the holder 6, or in an upstream direction of the ion beam 2).

A first deflecting power source 54 having a variable DC output voltage $V_{1L}$ is connected between one first stage deflecting electrode 50 closer to the holder 6 and the ground potential portion, with the former being at the positive electrode side. Also, a deflecting first power source 56 having a variable DC output voltage $V_{1R}$ is connected between the other first stage deflecting electrode 52 and the ground potential portion, with the former being at the positive electrode side. Two output voltages $V_{1L}$ and $V_{1R}$ are kept in a relation $V_{1R} > V_{1L} \geq 0$. The output voltages $V_{1L}$ and $V_{1R}$ are measured from the ground potential portion, and called the potential of the first stage deflecting electrodes 50 and 52, respectively. With the above constitution, a relation $V_{1R} > V_{1L} \geq 0$ holds, where the potential of the first stage deflecting electrode 50 closer to the holder 6 is $V_{1L}$ and the potential of the other first stage deflecting electrode 52 is $V_{1R}$. Thereby, an electric field $E_1$ passing from the deflecting electrode 52 to the deflecting electrode 50 is generated between two first stage deflecting electrodes 50 and 52. As an example of the potentials, the potential $V_{1L}$ is from about 0V to 10V, and the potential $V_{1R}$ is from about 0V to 20V, in which the above relation is satisfied.

Two second stage deflecting electrodes 60 and 62 are arranged near the front of the first stage deflecting electrodes 50 and 52 to be opposed to each other with a space between them. The two second stage deflecting electrodes 60 and 62 are arranged in parallel and spaced from each other along the longitudinal direction (i.e., X direction) of the thermoelectron generating source 10, like the first stage deflecting electrodes 50 and 52. That is, the space between the second stage deflecting electrodes 60 and 62 is in communication to the space between the first stage deflecting electrodes 50 and 52, in which both the spaces are in parallel to each other.

The mutual opposed faces 60a and 62a of the two second stage deflecting electrodes 60 and 62 are slanted with respect to the extraction electrode 26. More specifically, they are slanted in a direction facing the holder 6 (i.e., in a downstream direction of the ion beam 2).

A second deflecting power source 64 having a variable DC output voltage $V_{2L}$ is connected between one second stage deflecting electrode 60 closer to the holder 6 and the ground potential portion, with the former being at the positive electrode side. Also, a deflecting second power source 66 having a variable DC output voltage $V_{2R}$ is connected between the other second stage deflecting electrode 62 and the ground potential portion, with the former being at the positive electrode side. Two output voltages $V_{2L}$ and $V_{2R}$ are kept in a relation $V_{2L} > V_{2R} \geq 0$. The output voltages $V_{2L}$ and $V_{2R}$ are measured from the ground potential portion, and called the potential of the second stage deflecting electrodes 60 and 62, respectively. With the above constitution, a relation $V_{2L} > V_{2R} \geq 0$ holds, where the potential of the second stage deflecting electrode 60 closer to the holder 6 is $V_{2L}$ and the potential of the other second stage deflecting electrode 62 is $V_{2R}$. Thereby, an electric field $E_2$ passing from the deflecting electrode 60 to the deflecting electrode 62 is generated between two second stage deflecting electrodes 60 and 62. As an example of the potentials, the potential $V_{2L}$ is from about 10V to 20V, and the potential $V_{2R}$ is from about 0V to 10V, in which the above relation is satisfied.

With the thermoelectron generating source 10, the potentials of the two first stage deflecting electrodes 50 and 52 are kept in the relation $V_{1R} > V_{1L} \geq 0$, whereby positive potential can be generated over the entire area between the two deflecting electrodes 50 and 52. Also, the potentials of the two second stage deflecting electrodes 60 and 62 are kept in the relation $V_{2L} > V_{2R} \geq 0$, whereby positive potential can be generated over the entire area between the two deflecting electrodes 60 and 62. Thereby, it is possible to cancel the negative space changes (negative potentials) caused by the thermoelectrons 28 near the front of the extraction electrode 26 as previously described. The details of the operation are the same as with the thermoelectron generating source 10 as shown in FIG. 1 and previously described. As a result, it is possible to relieve the space charge limitation in front of the extraction electrode 26 in extracting the thermoelectrons, and generate a large amount of thermoelectrons 28 of low energy.

And since the mutual opposed faces 50a and 52a of the first stage deflecting electrodes 50 and 52 are slanted in the direction facing away from the holder 6 (i.e., the opposite direction to the holder 6), and the potential $V_{1L}$ of the deflecting electrode 50 closer to the holder 6 is lower than the potential $V_{1R}$ of the other deflecting electrode 52, the thermoelectrons 28 led out of the extraction electrode 26 are firstly bent in the direction facing away from the holder 6 by the electric field $E_1$ between the first stage deflecting electrodes 50 and 52. Furthermore, the mutual opposed faces 60a and 62a of the second stage deflecting electrodes 60 and 62 are slanted in the direction facing the holder 6, and the potential $V_{2L}$ of the deflecting electrode 60 closer to the holder 6 is higher than the potential $V_{2R}$ of the other deflecting electrode 62, so that the thermoelectrons 28 passing through the first stage deflecting electrodes 50 and 52 are bent back in the direction facing the holder 6 by the electric field $E_2$ between the second stage deflecting electrodes 60 and 62. As a result, the thermoelectrons 28 generated from the thermoelectron generating source 10 are conducted efficiently near the holder 6 and the substrate 4 held thereon, whereby it is possible to effectively suppress the charge-up on the surface of the substrate in radiating the ion beam. More particularly, the thermoelectrons 28 proceed to the substrate 4 while drawing a sinusoidal curve around the ion beam 2 as the axis in the almost same manner as with the thermoelectron generating source 10 of FIG. 1 (see FIG. 3 and its description).

Moreover, in this thermoelectron generating source 10, because the thermoelectrons 28 are bent back as above described, it is difficult to view the extraction electrode 26 of the thermoelectron generating source 10 and the main cathode 24 provided behind it from the substrate 4 held on the holder 6. As a result, it is possible to suppress metal particles produced from the main cathode 24 or the extraction electrode 26 along with the heating from jumping into the substrate 4, and prevent the substrate from being contaminated with the metal particles.

In this case, the second stage deflecting electrode 60 closer to the holder 6 preferably covers the front of the extraction electrode 26, so that the extraction electrode 26 may not be viewed from the substrate 4 on the holder 6, as shown in FIG. 4, for example. In other words, it is preferable to have the second stage deflecting electrode 60 overhang on the upstream side of a line 78 connecting an end portion 4a of the substrate 4 on the holder 6 opposite to the thermoelectron generating source 10 and an end portion 26a of the extraction electrode 26 opposite to the holder 6. To realize this, the second stage deflecting electrode 60 covers half or more of the extraction electrode 26 from the downstream side of the extraction electrode 26 to the vicinity of the central portion in this example.

In this manner, because the extraction electrode 26 of the thermoelectron generating source 10 and the main cathode 24 provided behind it are not viewed from the substrate 4 held on the holder 6, it is possible to suppress metal particles produced from the main cathode 24 or the extraction electrode 26 along with the heating from jumping into the substrate 4 more securely, and prevent the substrate 4 from being contaminated with the metal particles more securely.

In the embodiment as shown in FIG. 1, an equipotential surface 100 generated by beam potentials of the ion beam 2 is curved toward the extraction electrode 26 in front of the thermoelectron generating source 10, so that its influence, or an electric field caused by it, is exerted near the extraction electrode 26 of the thermoelectron generating source 10 to help to extract the thermoelectrons 28 from the extraction electrode 26, as shown in FIG. 3. On the contrary, in the embodiment of FIG. 4, an equipotential surface generated by a beam potential of the ion beam 2 is curved toward the thermoelectron generating source 10 as in the first embodiment of FIG. 1, but because the extraction electrode 26 is located further in the rear of the two stage deflecting electrodes, the influence of electric field from the beam potential is difficult to extend to the vicinity of the extraction electrode 26. That is, an auxiliary action of extracting the thermoelectrons 28 due to a beam potential of the ion beam 2 is less expected.

Thus, to supplement this, a second extraction electrode 68 kept at a positive potential relative to the extraction electrode 26 maybe disposed between the first stage deflecting electrodes 50, 52 and the second stage deflecting electrodes 60, 62, as in the embodiment of FIG. 4. This second extraction electrode 68 is made of metal, for example, and may be like a mesh as in this example or a porous plate having a number of pores. A second extraction power source 70 having a variable DC output voltage $V_2E$ is connected between the second extraction electrode 68 and the extraction electrode 26, with the former being at the positive electrode side, whereby the potential of the second extraction electrode 68 is kept as above, and the output voltage $V_2E$ is from about 5V to 10V.

If the second extraction electrode 68 is provided as above, the thermoelectrons 28 led out of the extraction electrode 26 are further led out toward the ion beam 2 by the second extraction electrode 68. If the thermoelectrons 28 are led out there, an auxiliary action of extracting the thermoelectrons 28 due to a beam potential of the ion beam 2 works effectively, as in the embodiment of FIG. 1. Even if the auxiliary action of extracting the thermoelectrons 28 due to the beam potential is not expected, it works favorably to extract the thermoelectrons 28. Accordingly, it is easier to extract a large amount of thermoelectrons 28 of low energy from the thermoelectron generating source 10.

Even if the second extraction electrode 68 is provided, the energy of thermoelectrons 28 getting to the substrate 4 is not affected. This is because the energy of the thermoelectrons 28 is decided depending on a potential difference between the main cathode 24 and the holder 6, as previously described.

Figure 5:
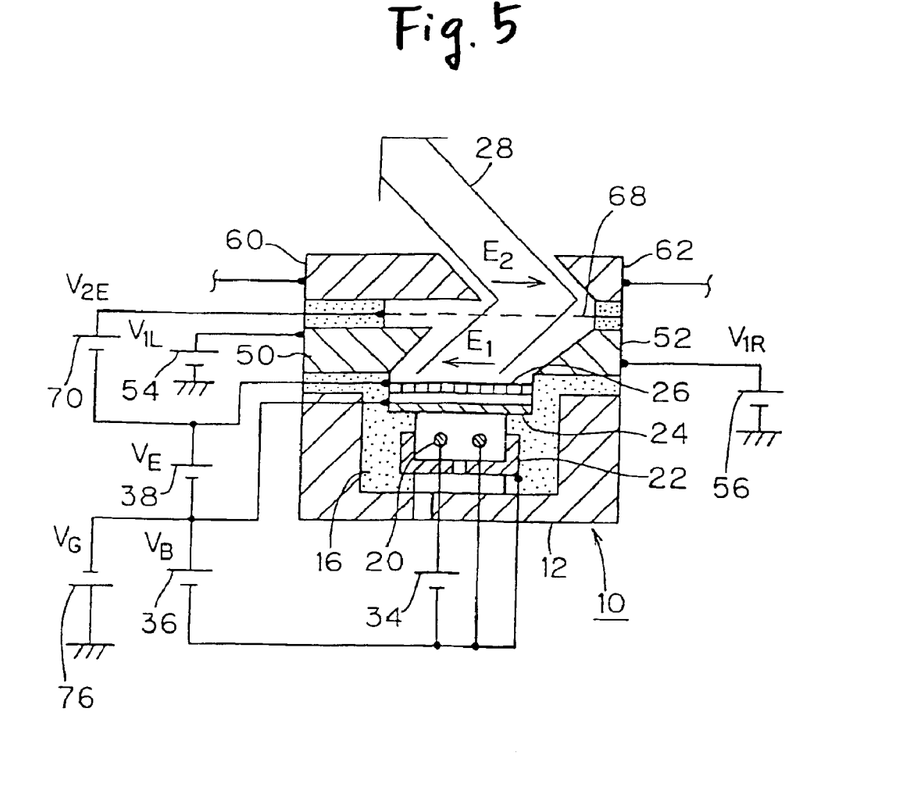
FIG. 5 is a view showing a thermoelectron generating source constituting an ion beam radiating apparatus according to another embodiment of the invention.

As a variation of the embodiment as shown in FIG. 4, a portion around the thermoelectron generating source 10 may be constituted as in an embodiment as shown in FIG. 5. This corresponds to the invention of claim 5. That is, the potential of the extraction electrode 26 is made more positive relative to the main cathode 24 by an output voltage $V_E$ of the extraction power source 38 without grounding the extraction electrode 26. The output voltage $V_E$ in this case may be kept in a range from about 10V to 20V. Moreover, an energy set-up power source 76 having a variable DC output voltage VG is connected between the main cathode 24 and the ground potential portion, with the former being at the negative electrode side, whereby the main cathode 24 is kept at a potential in a range from 0V to −6V relative to the holder 6. Preferably, the main cathode 24 is kept in a range from 0V to −3V or from −3V to −6V, as previously described. The other constitution is the same as the embodiment of FIG. 4, and not described duplicately.

In the embodiment of FIG. 5, the energy of thermoelectrons 28 in getting to the substrate 4 on the holder 6 is decided depending on a potential difference between the main cathode 24 and the holder 6, namely, an output voltage $V_G$ of the energy set-up power source 76. On the other hand, the amount of the thermoelectrons 28 to be led out through the extraction electrode 26 can be controlled in accordance with the potential of the extraction electrode 26 relative to the main cathode 24, namely, the output voltage $V_E$ of the extraction voltage 38. Accordingly, the amount of extracting the thermoelectrons 28 can be controlled in accordance with the output voltage $V_E$ of the extraction voltage 38, without having influence on the energy of thermoelectrons 28 in getting to the substrate 4 (i.e., independently of the energy). For example, a larger amount of thermoelectrons 28 can be led out by increasing the output voltage $V_E$.

FIG. 6 is a cross-sectional view showing an ion beam radiating apparatus according to a further embodiment of the invention. In this embodiment, the thermoelectron generating source 10 having the same constitution as shown in FIG. 1 is disposed obliquely to the upstream side of the ion beam 2. More specifically, the thermoelectron generating source 10 is disposed obliquely so that the angle α of the ion beam 2 (or its route) made to the perpendicular stood on the front face of the thermoelectron generating source 10 may be in a range from 30° to 60°. In this embodiment, the angle α is equal to 45°. As the thermoelectron generating source 10 is disposed obliquely, the opening portion 48 of the beam line vessel 46 is made considerably larger than in the embodiment of FIG. 1.

This thermoelectron generating source 10 is carried on a metallic holding board 92 via the insulator 16, 44 or 88 in this beam line vessel 46 in this example. Also, the mutual opposed faces 30a and 32a of the two deflecting electrodes 30 and 32 are slanted in a direction facing the ion beam 2. In this embodiment, they are slanted to be almost orthogonal to the ion beam 2.

Moreover, a pair of upstream deflecting electrodes 80 and 82 are arranged in front of the thermoelectron generating source 10 and at the positions almost symmetrical (or symmetrical) around the route. The two upstream deflecting electrodes 80 and 82 extend along a scan direction X correspondingly because the ion beam 2 is scanned in the X direction in this embodiment. Specifically, it has a columnar shape that is longer in the X direction.

Figure 7:
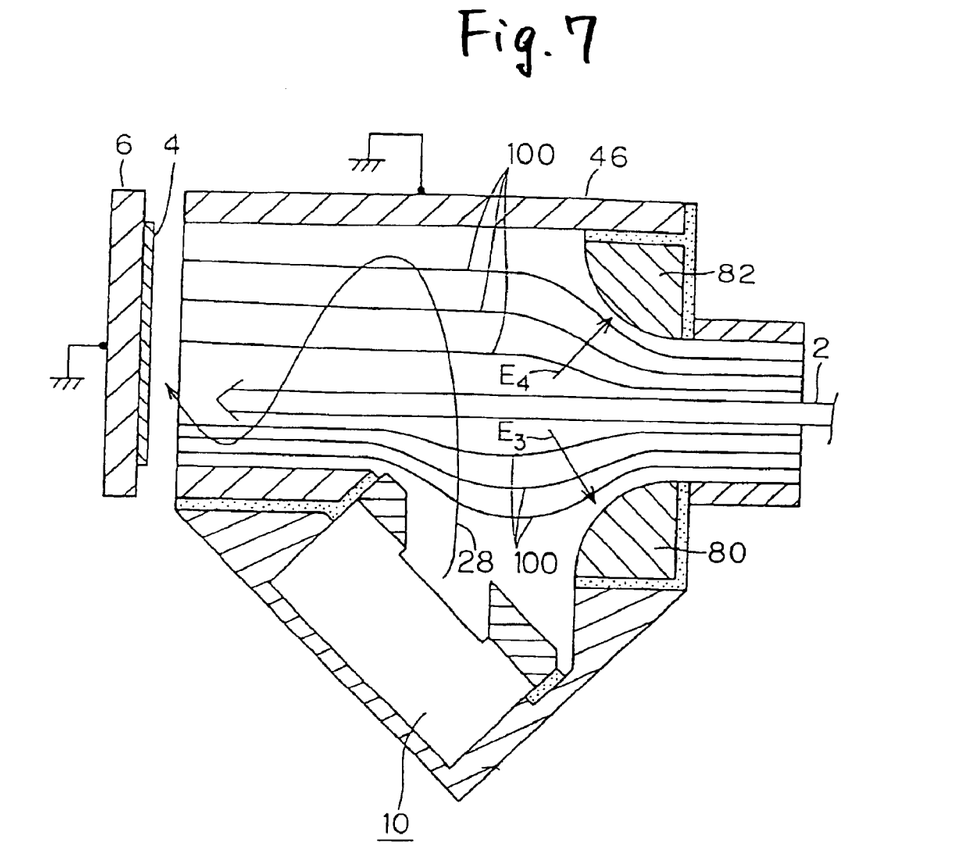
FIG. 7 is a schematic view showing one example of an orbit of a thermoelectron led out of the thermoelectron generating source in FIG. 6, with an equipotential surface around the ion beam.

At least the faces 80a and 82a of the two upstream deflecting electrodes 80 and 32 opposed to the ion beam 2 are curved. This is because the equipotential surfaces 100 between the two upstream deflecting electrodes 80, 82 and the ion beam 2 are made smoother, as shown in FIG. 7. A typical example of the curved surface is a columnar or cylindrical face. In this embodiment, the two upstream deflecting electrodes 80 and 82 have the same ¼ columnar shape. It is optional whether to curve other faces than the faces 80a and 82a or not. The two upstream deflecting electrodes 80, 82 and the beam line vessel 46 are electrically insulated by the insulators 88 and 90.

A third deflecting power source 84 having a variable DC output voltage $V_D$ is connected between one upstream deflecting electrode 80 closer to the thermoelectron generating source 10 (i.e., closer to the thermoelectron generating source 10 than the ion beam 2) and the ground potential portion, with the former being at the negative electrode side. Also, a third deflecting power source 86 having a variable DC output voltage $V_U$ is connected between the other upstream deflecting electrode 82 (i.e., on the opposite side of the ion beam 2) and the ground potential portion, with the former being at the negative electrode side. Two output voltages $V_D$ and $V_U$ are kept in a relation $0 \geq V_D > V_U$. The output voltages $V_D$ and $V_U$ are measured from the ground potential portion, and called the potential of the upstream deflecting electrodes 80 and 82, respectively. That is, with the above constitution, a relation $0 \geq V_D > V_U$ holds, where the potential of the upstream deflecting electrode 80 closer to the thermoelectron generating source 10 is $V_D$ and the potential of the other upstream deflecting electrode 82 is $V_U$. As a specific example of the potentials, the potential $V_D$ is from about 0V to −10V, and the potential $V_U$ is from about 0V to −50V, in which the above relation is satisfied. In this embodiment, the potential $V_D$ is 0V, and the potential $V_U$ is −50V.

The reason why the upstream deflecting electrodes 80 and 82 are provided as above is that the thermoelectron generating source 10 is disposed obliquely to the upstream side of the ion beam 2, and it is difficult to bend the thermoelectrons 28 in the direction facing the substrate 4 on the holder 6 only by the deflecting electrodes 30 and 32 constituting the thermoelectron generating source 10, whereby there is a need for compensation.

That is, if a pair of upstream deflecting electrodes 80 and 82 are arranged in front of the thermoelectron generating source 10 in which the above relation holds, the equipotential surfaces 100 curved along the upstream deflecting electrodes 80, 82 are formed between the two electrodes 80, 82 and the ion beam 2 having a positive potential, as shown in FIG. 7, so that the electric fields $E_3$, $E_4$ are formed in the oblique directions to the upstream side of the ion beam 2.

The thermoelectrons 28 emitted from the thermoelectron generating source 10 are subjected to an opposite force to the electric field $E_3$, $E_4$. That is, since the thermoelectrons 28 emitted from the thermoelectron generating source 10 are subjected to a force oblique to the ion beam 2 toward the downstream side of the ion beam 2 near the upstream deflecting electrodes 80 and 82, the thermoelectrons 28 emitted from the thermoelectron generating source 10 are bent on the downstream side by this force. Since the thermoelectrons 28 passing through the ion beam 2 are decelerated and reversed by being subjected to a force of electric field (beam potential) of the ion beam 2 as detailed previously with reference to FIG. 3, the thermoelectrons 28 proceed to the substrate 4 on the holder 6 while drawing a sinusoidal curve around the ion beam 2 as the axis, as shown in FIG. 7. Thereby, the thermoelectrons 28 get to the substrate 4 efficiently. As a result, it is possible to effectively suppress a charge-up on the surface of the substrate in radiating the ion beam.

Moreover, since the thermoelectron generating source 10 is disposed obliquely to the upstream side of the ion beam 2 as described above, it is difficult to view the extraction electrode 26 of the thermoelectron generating source 10 and the main cathode 24 provided behind it from the substrate 4 held on the holder 6. As a result, it is possible to suppress metal particles produced from the main cathode 24 or the extraction electrode 26 along with the heating from jumping into the substrate 4, and prevent the substrate 4 from being contaminated with the metal particles.

In this case, the holder 6 is preferably disposed such that the substrate 4 may be located on the downstream side of a line 94 connecting an upper end portion 30b of one deflecting electrode 30 closer to the ion beam 2 in the thermoelectron generating source 10 and an end portion 26a of the extraction electrode 26 opposite to the ion beam 2. In this embodiment, the beam line vessel 46 is lengthened on the downstream side by distance L from an intersection 96 where the line 94 intersects with the beam line vessel 46, whereby the holder 6 is disposed immediately on the downstream side of the beam line vessel 46.

In this manner, it is difficult to view the extraction electrode 26 of the thermoelectron generating source 10 and the main cathode 24 provided behind it from the substrate 4 held on the holder 6. Consequently, metal particles produced from the main cathode 24 or the extraction electrode 26 along with the heating are suppressed more securely from jumping into the substrate 4, and the substrate 4 is prevented more securely from being contaminated with the metal particles.

The reason why the potential $V_D$ of the upstream deflecting electrode 80 may be 0V is that the ion beam 2 has a positive beam potential as previously described, in which the electric field $E_3$ is formed. Both the potentials $V_D$ and $V_U$ have a relation $VD>V_U$. This relation is provided to bend the thermoelectrons 28 on the downstream side more sharply by forming a stronger electric field E4 near the upstream deflecting electrode 82 to which the thermoelectrons 28 are directed from the thermoelectron generating source 10. In this case, if $|V_U|$ is increased, the thermoelectrons 28 are bent at earlier stage, or if it is decreased, the thermoelectrons 28 are bent at later stage.

If the angle α is increased above 60°, the thermoelectron generating source 10 approaches in parallel to the ion beam 2, whereby the action of extracting thermoelectrons 28 due to the beam potential is increased, making it easier to extract the thermoelectrons 28 from the thermoelectron generating source 10. However, the extraction electrode 26 and the main cathode 24 provided behind it turn toward the substrate 4 on the holder 6. Therefore, it is required to place the holder 6 more downstream to prevent the substrate 4 from being contaminated with the metal particles, in which there is a problem that the apparatus is increased in size. If the angle α is decreased below 30°, there is less possibility that the substrate 4 is contaminated with the metal particles. However, the thermoelectrons 28 are led out more upstream from the thermoelectron generating source 10, whereby it is difficult to bend back the thermoelectrons 28 to the substrate 4. To bend back the thermoelectrons, it is required to increase the potentials $V_D$ and $V_U$ to the negative side, in which there is a problem that the capacities of the third deflecting electrodes 84 and 86 must be increased. From the above discussion, the angle α is preferably in a range from 30° to 60°, and more preferably about 45°.

This invention as constituted above has the following effects.

With a first aspect of the invention, it is possible to generate the positive potentials over the entire area between the two deflecting electrodes. Thereby, negative space charges due to thermoelectrons near the front of the extraction electrode are canceled. As a result, a large amount of thermoelectrons having low energy can be generated by relieving the space charge limitation in extracting the thermoelectrons.

With a second aspect of the invention, in thermoelectron generating source constituting this ion beam radiating apparatus, it is possible to generate the positive potentials over the entire area between the two deflecting electrodes. Thereby, negative space charges due to thermoelectrons near the front of the extraction electrode are canceled. As a result, a large amount of thermoelectrons having low energy can be generated by relieving the space charge limitation in extracting the thermoelectrons.

And since the mutual opposed faces of the two deflecting electrodes are slanted in a direction facing the holder, and the potential of one deflecting electrode closer to the holder is higher than the potential of the other deflecting electrode, the thermoelectrons led out of the extraction electrode are bent in the orbit toward the holder under an electric field between the two deflecting electrodes. As a result, it is possible to efficiently conduct the thermoelectrons generated from the thermoelectron generating source near the holder and the substrate held on the holder, and thereby effectively suppress a charge-up on the surface of the substrate in radiating the ion beam.

With a third aspect of the invention, in the thermoelectron generating source constituting the ion beam radiating apparatus, it is possible to generate the positive potentials over the entire area between the two first stage deflecting electrodes and over the entire area between the two second stage deflecting electrodes. Thereby, negative space charges due to thermoelectrons near the front of the extraction electrode are canceled. As a result, a large amount of thermoelectrons having low energy can be generated by relieving the space charge limitation in extracting the thermoelectrons.

And since the mutual opposed faces of the two second stage deflecting electrodes are slanted in a direction facing the holder, and the potential of one deflecting electrode closer to the holder is higher than the potential of the other deflecting electrode, the thermoelectrons passing through the first stage deflecting electrodes are bent back in the direction facing the holder under an electric field between the two second stage deflecting electrodes. As a result, it is possible to efficiently conduct the thermoelectrons generated from the thermoelectron generating source near the holder and the substrate held on the holder, and thereby effectively suppress a charge-up on the surface of the substrate in radiating the ion beam.

Moreover, since the thermoelectrons are bent back as above described, it is difficult to view the extraction electrode of the thermoelectron generating source and the main cathode provided behind it from the substrate held on the holder. Consequently, it is possible to suppress metal particles produced from the main cathode and the extraction electrode by heating from jumping into the substrate, and prevent the substrate from being contaminated with the metal particles.

A fourth aspect of invention has the following effect, in addition to the same effect as defined in the third aspect.

Since the energy of thermoelectrons in getting to the substrate is decided depending on a potential difference between the main cathode of the thermoelectron generating source and the holder, it is possible to control the amount of extracting the thermoelectrons in accordance with the potential of the extraction electrode relative to the main cathode, without having influence on the energy of thermoelectrons in getting to the substrate (i.e., independently of the energy).

With a fifth aspect of the invention, it is difficult to view the extraction electrode of the thermoelectron generating source and the main cathode provided behind it from the substrate held on the holder. Consequently, there is another effect that it is possible to suppress metal particles produced from the main cathode and the extraction electrode by heating from jumping into the substrate, and prevent the substrate from being contaminated with the metal particles.

With a sixth aspect of the invention, there is another effect that it is easy to extract a large amount of thermoelectrons having low energy from the thermoelectron generating source.

With a seventh aspect of the invention, in the thermoelectron generating source constituting this ion beam radiating apparatus, it is possible to generate the positive potentials over the entire area between the two deflecting electrodes. Thereby, negative space charges due to thermoelectrons near the front of the extraction electrode are canceled. As a result, a large amount of thermoelectrons having low energy can be generated by relieving the space charge limitation in extracting the thermoelectrons.

And a pair of upstream deflecting electrodes are disposed in front of the thermoelectron generating source, whereby the thermoelectrons led out of the thermoelectron generating source are subjected to a force that tends to bend the ion beam downstream under an electric field formed between the two electrodes and the ion beam having positive potential and directed to the substrate. As a result, it is possible to efficiently conduct the thermoelectrons generated from the thermoelectron generating source near the holder and the substrate held on the holder, and thereby effectively suppress a charge-up on the surface of the substrate in radiating the ion beam.

Moreover, since the thermoelectron generating source is disposed obliquely to the upstream side of the ion beam as above described, it is difficult to view the extraction electrode of the thermoelectron generating source and the main cathode provided behind it from the substrate held on the holder. Consequently, it is possible to suppress metal particles produced from the main cathode and the extraction electrode by heating from jumping into the substrate, and prevent the substrate from being contaminated with the metal particles.

With an eight aspect of the invention, it is difficult to view the extraction electrode of the thermoelectron generating source and the main cathode provided behind it from the substrate held on the holder. Consequently, it is possible to more securely suppress metal particles produced from the main cathode and the extraction electrode by heating from jumping into the substrate, and more securely prevent the substrate from being contaminated with the metal particles.

What is claimed is:

1. A thermoelectron generating source comprising:
   a facial main cathode for emitting thermoelectrons from one surface by being heated from the other surface;
   a filament for heating said main cathode from the other surface of the main cathode to emit said thermoelectrons;
   an extraction electrode for extracting said thermoelectrons emitted from said main cathode under an electric field, said extraction electrode being provided near the front of said main cathode; and
   two deflecting electrodes disposed near the front of said extraction electrode to carry said extraction electrode, the two deflecting electrodes having slanted mutually opposed faces, in which a relation $V_L > V_R \geq 0$ holds, where the potential of one deflecting electrode is $V_L$ and the potential of the other deflecting electrode is $V_R$.

2. An ion beam radiating apparatus for radiating an ion beam to a substrate held on a holder to process the substrate, said ion beam radiating apparatus having a thermoelectron generating source for emitting thermoelectrons to a route of the ion beam, said thermoelectron generating source being placed sideways of the route of the ion beam, said thermoelectron generating source comprising:
   a facial main cathode for emitting thermoelectrons from one surface by being heated from the other surface, said main cathode being kept at a potential in a range from 0V to −6V relative to said holder;
   a filament for heating said main cathode from the other surface of the main cathode behind to emit the thermoelectrons;
   an extraction electrode for extracting the thermoelectrons emitted from said main cathode under an electric field, said extraction electrode being provided near the front of said main cathode and kept at the same potential as said holder;
   two deflecting electrodes disposed near the front of said extraction electrode to carry said extraction electrode, the mutual opposed faces of said two deflecting electrodes being slanted in a direction facing said holder, in which a relation $V_L > V_R \geq 0$ holds, where the potential of one deflecting electrode closer to said holder is $V_L$ and the potential of the other deflecting electrode is $V_R$.

3. An ion beam radiating apparatus for radiating an ion beam to a substrate held on a holder to process the substrate, said ion beam radiating apparatus having a thermoelectron generating source for emitting thermoelectrons to a route of the ion beam, said thermoelectron generating source being placed sideways of the route of the ion beam, said thermoelectron generating source comprising:
   a facial main cathode for emitting thermoelectrons from one surface by being heated from the other surface, said main cathode being kept at a potential in a range from 0V to −6V relative to said holder;
   a filament for heating said main cathode from the other surface of the main cathode to emit the thermoelectrons;
   an extraction electrode for extracting the thermoelectrons emitted from said main cathode under an electric field, said extraction electrode being provided near the front of said main cathode;
   two first stage deflecting electrodes disposed near the front of said extraction electrode to carry said extraction electrode and be opposed to each other with a space between them, the mutual opposed faces of said two first stage deflecting electrodes being slanted in a direction facing away from said holder, in which a relation $V_{1R} > V_{1L} \geq 0$ holds, where the potential of one first stage deflecting electrode closer to said holder is $V_{1L}$ and the potential of the other first stage deflecting electrode is $V_{1R}$; and
   two second stage deflecting electrodes disposed near the front of said first stage deflecting electrodes and opposed to each other with a space between them, said space between said second stage deflecting electrodes being in communication to said space between said first stage deflecting electrodes, the mutual opposed faces of said two second stage deflecting electrodes being slanted in a direction facing said holder, in which a relation $V_{2L} > V_{2R} \geq 0$ holds, where the potential of one second stage deflecting electrode closer to said holder is $V_{2L}$ and the potential of the other second stage deflecting electrode is $V_{2R}$.

4. The ion beam radiating apparatus according to claim 3, wherein said extraction electrode is kept at the same potential as said holder.

5. The ion beam radiating apparatus according to claim 3, wherein said extraction electrode is kept at a positive potential relative to said main cathode.

6. The ion beam radiating apparatus according to claim 3, wherein said one second stage deflecting electrode closer to said holder in said thermoelectron generating source covers the front of said extraction electrode so that said extraction electrode can not be viewed from the substrate on said holder.

7. The ion beam radiating apparatus according to claim 3, wherein said thermoelectron generating source further comprises a second extraction electrode disposed between said first stage deflecting electrodes and said second stage deflecting electrodes and kept at a positive potential relative to said extraction electrode.

8. The ion beam radiating apparatus according to claim 2, further comprising:

a pair of upstream deflecting electrodes disposed in front of said thermoelectron generating source and at the positions almost symmetrical around the route of said ion beam, at least the faces of said pair of upstream deflecting electrodes opposing the ion beams being curved, in which a relation $0 \geq V_D > V_U$ holds, where the potential of one upstream deflecting electrode closer to said thermoelectron generating source is $V_D$ and the potential of the other upstream deflecting electrode is $V_U$, wherein said thermoelectron generating source is disposed obliquely to the upstream side of the ion beam so that the angle of said ion beam made to the vertical line stood on a front face of said thermoelectron generating source may be in a range from 30° to 60°.

9. The ion beam radiating apparatus according to claim 8, wherein said holder is disposed such that the substrate may be located on the downstream side of a line connecting an upper end portion of one deflecting electrode closer to the ion beam in said thermoelectron generating source and an end portion of said extraction electrode opposite to the ion beam.

* * * * *